United States Patent [19]

Fox et al.

[11] 4,086,503
[45] Apr. 25, 1978

[54] CONTROL CIRCUIT INITIATING CONDUCTION OF AN OPTO-ISOLATOR UNIT

[75] Inventors: David A. Fox, Shawnee Township, Allen County; Otto L. Apfelbeck, Fort Shawnee, both of Ohio

[73] Assignee: Westinghouse Electric Corporation, Pittsburgh, Pa.

[21] Appl. No.: 698,253

[22] Filed: Jun. 21, 1976

[51] Int. Cl.² .......................... H03K 5/20; H03K 5/08
[52] U.S. Cl. ..................................... 307/363; 307/237; 307/254; 307/311; 307/318; 307/297
[58] Field of Search .......... 307/235 R, 235 T, 235 W, 307/237, 297, 318, 311, 254

[56] References Cited

U.S. PATENT DOCUMENTS 3,937,987  2/1976  Ahmed ........................... 307/235 W

*Primary Examiner*—John Zazworsky
*Attorney, Agent, or Firm*—G. H. Telfer

[57] ABSTRACT

A control circuit for turning on an optical isolation unit only when an input signal is at least of a given magnitude or threshold level. The circuit exhibits a resistive input below the threshold level and a constant current characteristic above the threshold. An arrangement of transistors is provided to bypass the opto-isolator below the threshold and to drive the opto-isolator with substantially constant current above the threshold.

3 Claims, 2 Drawing Figures

4,086,503

CONTROL CIRCUIT INITIATING CONDUCTION OF AN OPTO-ISOLATOR UNIT

GOVERNMENT CONTRACT

This invention was made under a contract with the National Aeronautics and Space Administration.

BACKGROUND OF THE INVENTION

This invention relates to electronic control circuits and particularly to circuits for controlling the drive of a voltage responsive device such as the input light emitting diode of an optical isolator.

Various means are known for responding to a control input signal to drive a voltage responsive element when the input is of a sufficient magnitude. For example, numerous control circuits use opto-isolators comprising, on the input side, a light emitting diode which responds to voltage by emitting radiation to which an output photodiode or phototransistor responds. In some applications, the energization of the light emitting diode desirably occurs only when the control input signal is above a defined threshold level. Among the arrangements used are those in which a voltage limiter such as a zener diode establishes the threshold level. Such arrangements are satisfactory for some purposes, but two features of their operation are disadvantages in certain applications. First, the use of a zener diode as the key voltage limiting element means that the input resistance is very high below the turn-on point, which makes the input sensitive to high impedance noise pulses. Additionally, at relatively high input voltage levels, the input current and, hence, power dissipation become excessive.

In copending application Ser. No. 608,227, filed June 21, 1976, by D. A. Fox and assigned to the assignee, there is disclosed a solid state relay which among its various features employs an opto-isolator unit for producing an isolated control signal for the input of a control logic circuit. The overall circuit of the copending application is one in which the present invention may be advantageously employed and it will be in the context of such a circuit that the present invention will be described although it will be understood that the circuit of the present invention may be applied elsewhere in the same or essentially similar form.

SUMMARY OF THE INVENTION

In accordance with the present invention, a control circuit is provided for driving an optica isolation unit, or the like, only when an input signal is at least of a given magnitude. The control circuit exhibits a resistive input below the threshold level and a constant current characteristic above the threshold. For this purpose, an arrangement of transistors is provided to bypass the opto-isolator below the threshold and to drive the opto-isolator with substantially constant current above the threshold.

The circuit of the present invention employs a zener diode to establish the threshold conduction level of a certain transistorized portion of the circuit, but prior to initiation of conduction of that portion of the circuit a separate transistorized portion of the circuit is conductive and provides a resistive input (i.e., with current increasing with voltage at a linear rate) that makes the circuit less sensitive to high impedance noise pulses. When the zener diode threshold is reached and the first referred to transistorized circuit portion becomes conductive to drive the light emitting diode of the opto-isolator, the current level is limited to a substantially uniform magnitude so as to provide lower power dissipation.

PREFERRED EMBODIMENT OF THE INVENTION

Figure 1:
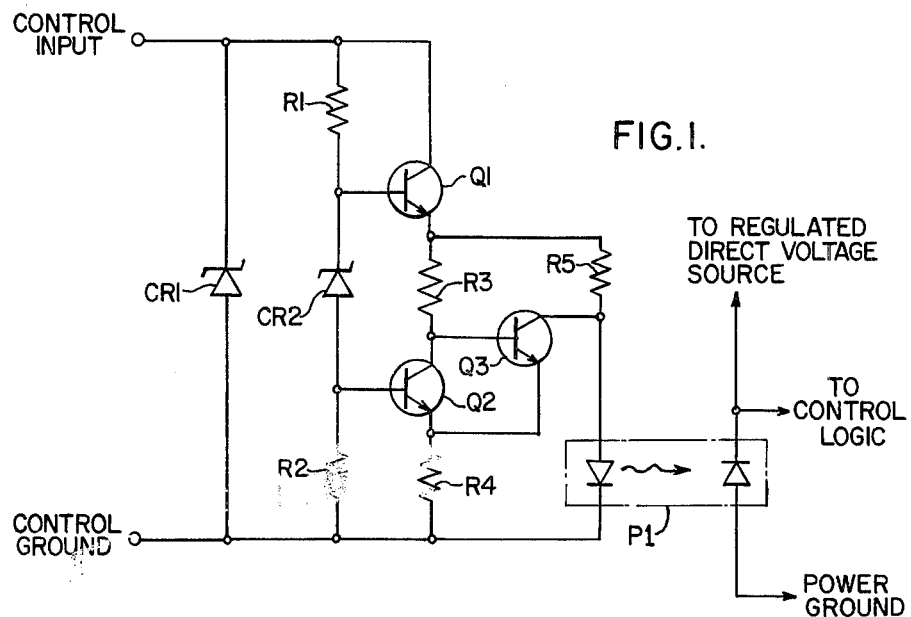
FIG. 1 is a circuit schematic of one embodiment of the present invention.

Referring to FIG. 1, there is shown a circuit with a control input terminal for receiving an input signal such as one indicative of certain system conditions.

Between the control input terminal and a control ground, or reference potential, terminal are connected a first circuit branch with a voltage limiting device which in this example is a zener diode CR1 with a characteristic voltage breakdown that is relatively high compared with the nominal control voltage. CR1 serves as a protection device for the balance of the circuit.

A second circuit branch between the terminals includes resistor R1, a voltage limiter (zener diode CR2), and resistor R2. R1 is connected to the input and across the base and collector of a first transistor Q1 (NPN in this example). R2 is connected between ground and the base of a second transistor Q2 (also NPN). CR2 is connected between the bases of Q1 and Q2. Q1 has its emitter connected through resistor R3 to the collector of Q2 and the base of a third transistor (also NPN) Q3. Q2 has its emitter connected directly to the emitter of Q3 and also through resistor R4 to the ground. Resistor R5 is connected on one side to the emitter of Q1 and on the other side to the collector of Q3 and also the anode of the light emitting diode of opto-isolator unit P1. Opto-isolator P1 has on its output side a photodiode receiving and responsive to radiation from the light emitting diode to influence a secondary circuit which may, as an example, be as disclosed in the above identified copending application.

The threshold of the circuit is determined by the voltage limiter CR2 in series with the base of Q2. Below the threshold point, CR2 is non-conductive, so all of the current through R1 therefore flows into the base of Q1. Q2 is off during this time. With Q1 on, current flows through R3 and into the base of Q3. Q3 is thus turned on, shunting current from R5 away from isolator P1 through R4 to ground. Below the threshold of CR2, the current and voltage of the circuit is as shown in part A of characteristic curve of FIG. 2 while the P1 diode current is zero (part B).

At the threshold, CR2 starts to conduct, turning on Q2 and turning off Q3. The current through R5 then flows through P1, turning on the light emitting diode. Resistor R4 is of a magnitude to provide a small amount of hysteresis in the pickup point to provide a clean switching action with no chance of oscillation or intermediate states in the output.

Figure 2:
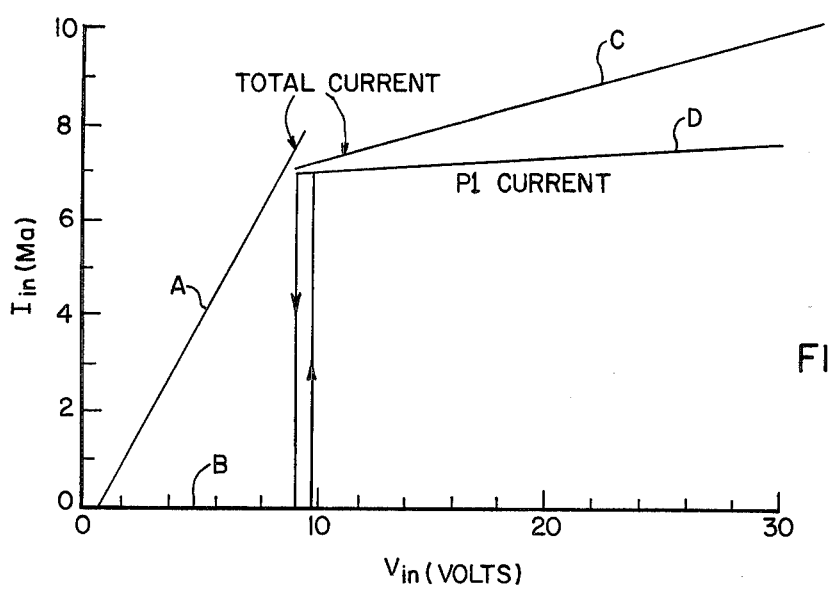
FIG. 2 is a characteristic curve showing the operation of circuits in accordance with the present invention.

The characteristic curve of FIG. 2 shows how the total circuit current increases in part C while the opto-isolator current levels off in part D.

By way of further example, the following identification of components is presented as one combination that is suitable for use in the circuit of this invention and in accordance with the requirements of the solid state relay as described in the copending application. This specific circuit provides a turn-on point between 8–12 volts dc, in a system where the nominal supply voltage is 28 volts dc with steady state voltage being allowed to go to 34 volts dc. The values given in the characteristic curve of FIG. 2 are for the operation of such a circuit.

| | |
|---|---|
| Zener diode CR1 | 68 volt breakdown voltage |
| Zener diode CR2 | 8.2 volt breakdown voltage |
| Transistors Q1, Q2 and Q3 | 2 N 3019 |
| Resistor R1 | 10,000 ohms |
| Resistor R2 | 47,000 ohms |
| Resistor R3 | 30,000 ohms |
| Resistor R4 | 100 ohms |
| Resistor R5 | 1,000 ohms |
| Opto-isolator P1 | MCD2 |

What we claim is:

1. An electronic control circuit comprising:
a pair of input terminals for receiving a voltage signal;
means responsive to voltage to produce a given response;
means for keeping said voltage signal at said input terminals from appearing across said voltage responsive means unless said voltage signal is at least of a predetermined magnitude, said means comprising a voltage limiting device arranged to prevent application of said voltage, below said predetermined magnitude, to said responsive means, and said voltage limiting device causing current produced by said signal to flow in a first path shunting said responsive means so long as said signal is below said predetermined magnitude and said voltage limiting device becoming conductive and causing current produced by said signal to flow in a second path to said responsive means when said signal is at least of said predetermined magnitude; and
means for maintaining said voltage responsive means at a substantially constant current flow when said voltage signal is at least of said predetermined magnitude.

2. An electronic control circuit in accordance with claim 1 wherein:
said voltage responsive means is a light-emitting diode of an optical isolator unit and said voltage limiting device is a zener diode.

3. An electronic control circuit in accordance with claim 1 wherein:
a first transistor and a second transistor are arranged in said first path for conduction upon the application of an input voltage signal below said predetermined magnitude shunting current away from said voltage responsive device;
a third transistor is arranged to become conductive upon the input voltage signal exceeding said predetermined magnitude causing said second transistor to be turned off.

* * * * *